US012796108B2

(12) United States Patent
Kocon et al.

(10) Patent No.: US 12,796,108 B2
(45) Date of Patent: Nov. 10, 2026

(54) SEMICONDUCTOR DEVICES WITH HIGH CURRENT CAPABILITY FOR ELECTROSTATIC DISCHARGE OR SURGE PROTECTION

(71) Applicant: Texas Instruments Incorporated, Dallas, TX (US)

(72) Inventors: Christopher Kocon, Mountain Top, PA (US); Sunglyong Kim, Allen, TX (US); Sreeram N. S., Bangalore (IN); Sudheer Prasad, Bangalore (IN); Sandip Lashkare, Nanded (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 740 days.

(21) Appl. No.: 17/855,105

(22) Filed: Jun. 30, 2022

(65) Prior Publication Data

US 2023/0223393 A1 Jul. 13, 2023

Related U.S. Application Data

(60) Provisional application No. 63/299,310, filed on Jan. 13, 2022, provisional application No. 63/299,302, filed on Jan. 13, 2022.

(51) Int. Cl.
*H10D 89/60* (2025.01)

(52) U.S. Cl.
CPC ........... *H10D 89/60* (2025.01); *H10D 89/611* (2025.01); *H10D 89/921* (2025.01)

(58) Field of Classification Search
CPC ..... H10D 89/60; H10D 89/921; H10D 89/711
See application file for complete search history.

(56) References Cited

U.S. PATENT DOCUMENTS 5,032,887 A * 7/1991 Oliveri ................. H10D 64/231
257/E29.174
5,870,268 A 2/1999 Lin et al.
(Continued)

FOREIGN PATENT DOCUMENTS

CN 1520614 A 8/2004
CN 201478303 U 5/2010
(Continued)

OTHER PUBLICATIONS

Notification of Transmittal of the International Search Report and the Written Opinion of Thie International Searching Authority, or the Declaration; mail date: May 4, 2017.
(Continued)

*Primary Examiner* — Telly D Green
(74) *Attorney, Agent, or Firm* — Yudong Kim; Charles F. Koch

(57) ABSTRACT

Semiconductor devices with high current capability for ESD or surge protection are described. The semiconductor device includes multiple n-type semiconductor regions in a p-type semiconductor layer. Each of the n-type semiconductor regions may have a footprint with a circular, oval, or obround shape. Moreover, a boundary of the footprint may be spaced apart from an isolation structure that surrounds the p-type semiconductor layer. The n-type semiconductor regions may be coupled to a terminal through individual groups of contacts that are connected to the n-type semiconductor regions, respectively. Additionally, or alternatively, the p-type semiconductor layer surrounded by the isolation structure may not include any re-entrant corner.

32 Claims, 10 Drawing Sheets

(56) References Cited

U.S. PATENT DOCUMENTS

| | | | | |
|---|---|---|---|---|
| 6,677,643 | B2 | 1/2004 | Iwamoto et al. | |
| 7,525,779 | B2 | 4/2009 | Chen et al. | |
| 7,728,382 | B2 | 6/2010 | Tsuzuki et al. | |
| 8,377,757 | B2 | 2/2013 | Hawe et al. | |
| 8,546,878 | B2 * | 10/2013 | Darwish | H10D 30/66 257/E29.066 |
| 9,773,777 | B2 | 9/2017 | Strachan et al. | |
| 10,153,269 | B2 | 12/2018 | Strachan et al. | |
| 2004/0201044 | A1 * | 10/2004 | Diefenbeck | H10D 8/00 257/E29.034 |
| 2005/0286186 | A1 | 12/2005 | Chang | |
| 2008/0169513 | A1 * | 7/2008 | Denison | H01L 24/05 257/370 |
| 2008/0197446 | A1 | 8/2008 | Disney et al. | |
| 2008/0203389 | A1 | 8/2008 | Ozoe et al. | |
| 2010/0314660 | A1 | 12/2010 | Salih et al. | |
| 2012/0161226 | A1 * | 6/2012 | Darwish | H10D 30/66 257/330 |
| 2012/0299053 | A1 | 11/2012 | Mauder et al. | |
| 2013/0299849 | A1 | 11/2013 | Tega et al. | |
| 2014/0097489 | A1 | 4/2014 | Roig-Guitart et al. | |
| 2015/0048382 | A1 | 2/2015 | Takeuchi et al. | |
| 2015/0364562 | A1 | 12/2015 | Tokomoto et al. | |
| 2017/0084601 | A1 | 3/2017 | Yao | |
| 2017/0200712 | A1 * | 7/2017 | Strachan | H10D 89/611 |
| 2017/0345811 | A1 * | 11/2017 | Yin | H02H 9/04 |
| 2018/0047717 | A1 * | 2/2018 | Wang | H10D 62/105 |
| 2019/0371786 | A1 | 12/2019 | Chenhsu | |
| 2020/0135714 | A1 | 4/2020 | Mallikarjunaswamy | |
| 2020/0381417 | A1 | 12/2020 | Salcedo | |
| 2020/0381424 | A1 | 12/2020 | Shukla | |
| 2021/0384333 | A1 | 12/2021 | Sato | |
| 2023/0022588 | A1 | 1/2023 | Mao | |
| 2023/0168298 | A1 | 6/2023 | Yeh | |

FOREIGN PATENT DOCUMENTS

| | | | |
|---|---|---|---|
| CN | 103367393 | A | 10/2013 |
| CN | 108604606 | A | 9/2018 |
| CN | 112530935 | A | 3/2021 |
| WO | 2013042406 | A1 | 3/2013 |
| WO | 2017/120511 | A1 | 7/2017 |

OTHER PUBLICATIONS

China National Intellectual Property Administration Search Report, T75677CN01, Application No. 201780010004.X, Filing Date Jan. 6, 2017.

* cited by examiner

SEMICONDUCTOR DEVICES WITH HIGH CURRENT CAPABILITY FOR ELECTROSTATIC DISCHARGE OR SURGE PROTECTION

CROSS-REFERENCE TO RELATED APPLICATIONS

The present Application for Patent claims the benefit of the following U.S. Provisional Patent Applications: (i) "D2 Diode Placement Optimization for Ultra Low Capacitance ESD Diode," Application No. 63/299,310, filed Jan. 13, 2022 and (ii) "Protection ESD Diode Layout and Design," Application No. 63/299,302, filed Jan. 13, 2022; each of which is hereby incorporated by reference in its entirety herein. This application is related to U.S. application Ser. No. 17/854,998 entitled "Electrostatic Discharge Protection Devices with High Current Capability," filed herewith Jun. 30, 2022, which is hereby incorporated by reference in its entirety herein.

TECHNICAL FIELD

The present disclosure generally relates to the field of semiconductor devices, and more particularly to semiconductor devices with high current capability for electrostatic discharge or surge protection.

BACKGROUND

Integrated circuits (ICs) can be subject to electrostatic discharge (ESD) or surge events. ESD events typically occur when the ICs are brought in contact with or close to another object. Surge events typically refer to situations in which ICs experience undesirable voltage increases for relatively longer periods than the ESD events. Various protection devices can be coupled with ICs to protect them by providing current paths during the ESD or surge events. It would be desirable for the protection devices to be able to safely dissipate high current without incurring damage. During normal operations of the ICs, the protection devices are inactive so as not to interfere with the normal operations. Although the protection devices are inactive (e.g., a diode under a reverse bias condition), their presence tends to increase parasitic capacitance for the ICs. It would be desirable for the protection devices to have low capacitance.

SUMMARY

The present disclosure describes ESD or surge protection devices with high current capability. Moreover, the protection devices include diodes with low capacitance. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

In some embodiments, a semiconductor device may include a p-type semiconductor layer including a plurality of n-type semiconductor regions, where each of the n-type semiconductor regions has: a footprint with a circular, oval, or obround shape; a boundary of the footprint spaced apart from an isolation structure that surrounds the p-type semiconductor layer; and a group of contacts connected to the n-type semiconductor region, where individual groups of contacts of the n-type semiconductor regions are coupled to a terminal.

In some embodiments, a semiconductor device includes an n-type substrate; an n-type layer on the substrate; a p-type layer over the n-type layer; and a first area including a plurality of n-type regions in the p-type layer, where each of the n-type regions has: a footprint with a circular, oval, or obround shape; a boundary of the footprint spaced apart from a first isolation structure that surrounds the first area; and a first group of contacts connected to the n-type region, where individual first groups of contacts of the n-type regions are coupled to a terminal.

In some embodiments, a semiconductor device includes an n-type substrate; an n-type layer on the substrate; a p-type layer over the n-type layer; a first low capacitance (LC) diode area; a second LC diode area located at a first side of the first LC diode area; and a third LC diode area located at a second side of the first LC diode area opposite to the first side, where: each of the first, second, and third LC diode areas includes a plurality of n-type regions in the p-type layer, each of the n-type regions having: a footprint with a circular, oval, or obround shape; a boundary of the footprint spaced apart from an isolation structure that surrounds the LC diode area; and a first group of contacts connected to the n-type region, where individual first groups of contacts of the n-type regions are coupled to each other.

DETAILED DESCRIPTION

Figure 1A:
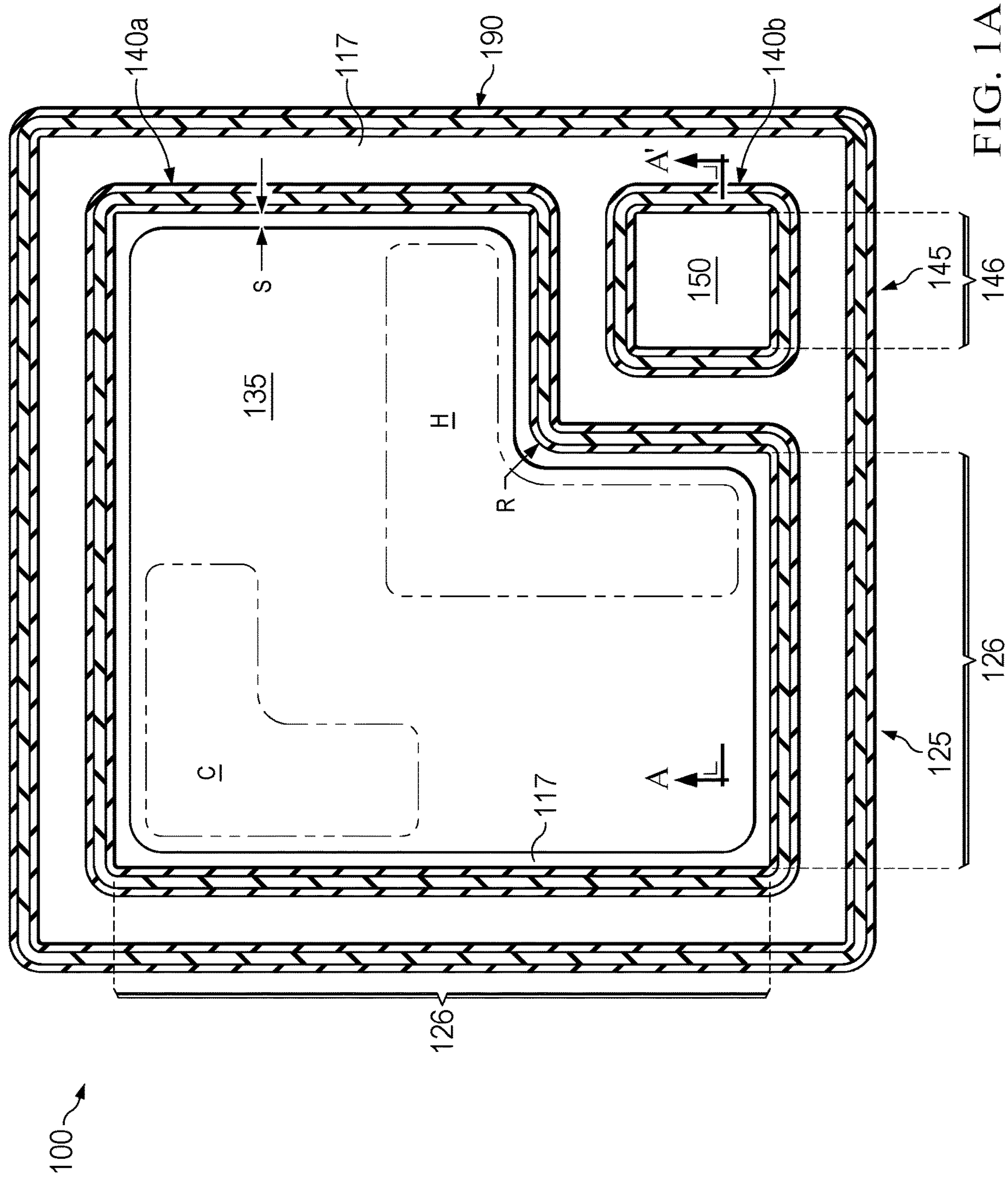
FIGS. 1A and 1B illustrate schematic diagrams of a semiconductor device in plan and cross-sectional views in accordance with embodiments of the present disclosure.

The present disclosure is described with reference to the attached figures. The components in the figures are not drawn to scale. Instead, emphasis is placed on clearly illustrating overall features and the principles of the present disclosure. Numerous specific details and relationships are set forth with reference to example embodiments of the figures to provide an understanding of the disclosure. It is to be understood that the figures and examples are not meant to limit the scope of the present disclosure to such example embodiments, but other embodiments are possible by way of interchanging or modifying at least some of the described or illustrated elements. Moreover, where elements of the present disclosure can be partially or fully implemented using known components, those portions of such components that facilitate an understanding of the present disclosure are described, and detailed descriptions of other portions of such components are omitted so as not to obscure the disclosure.

Various structures disclosed herein can be formed using semiconductor process techniques. Layers including a variety of materials can be formed over a substrate, for example, using deposition techniques (e.g., chemical vapor deposition, physical vapor deposition, atomic layer deposition, spin coating, plating), thermal process techniques (e.g., oxidation, nitridation, epitaxy), and/or other suitable techniques. Similarly, some portions of the layers can be selectively removed, for example, using etching techniques (e.g., plasma (or dry) etching, wet etching), chemical mechanical planarization, and/or other suitable techniques, some of which may be combined with photolithography steps.

The semiconductor devices, integrated circuits, or IC components described herein may be formed on a semiconductor substrate (or die) including various semiconductor materials, such as silicon, germanium, silicon-germanium alloy, gallium arsenide, gallium nitride, silicon carbide, or the like. In some cases, the substrate refers to a semiconductor wafer. The conductivity (or resistivity) of the substrate (or regions of the substrate) can be controlled by doping techniques using various chemical species (which may also be referred to as dopant atoms) including, but not limited to, boron, indium, arsenic, or phosphorus. Doping may be performed during the initial formation or growth of the substrate (or an epitaxial layer grown on the substrate), by ion-implantation, or other suitable doping techniques.

As used herein, terms such as “first” and “second” are used to arbitrarily distinguish between the elements such terms describe. Thus, these terms in the description and in the claims are not intended to indicate temporal or other prioritization of such elements. Moreover, terms such as “front,” “back,” “top,” “bottom,” “over,” “under,” “vertical,” “horizontal,” “lateral,” “down,” “up,” “upper,” “lower,” or the like, are used to refer to relative directions or positions of features in the semiconductor devices in view of the orientation shown in the figures. For example, “upper” or “uppermost” can refer to a feature positioned closer to the top of a page than other features. It is to be understood that the terms so used are interchangeable under appropriate circumstances such that the embodiments of the technology described herein are, for example, capable of operation in other orientations than those illustrated or otherwise described herein.

Diodes are used in a variety of protection devices against ESD or surge events. Typically, silicon-controlled rectifier (SCR) or bipolar avalanche phenomena including one or more pn junctions provide low resistance current-voltage (I-V) characteristics suitable for ESD or surge protection. For example, a bidirectional protection diode configuration includes back-to-back diodes (e.g., a D1-Z1 diode with diodes D1 and Z1 having a common anode) of a unit cell combined with a forward biased diode (e.g., a diode D2) of another unit cell next to the unit cell to provide a current path during ESD or surge events. Such a configuration may facilitate amplifying the avalanche current based on the bipolar transistor gain of the back-to-back D1-Z1 diode (e.g., open-base npn transistor).

It is common practice to increase areas of the protection devices to improve their performance—e.g., to increase amounts of current (e.g., ESD current or surge current) for the protection devices to safely dissipate. Increasing device areas, however, may not lead to increased current handling capability in some instances. For example, localized current crowding phenomena (which may be referred to as hot spots) may hinder the entire device area from uniformly participating in conducting the current. In some cases, enhanced avalanche breakdown phenomena near isolation regions (e.g., trench isolation regions) of the protection devices may worsen the localized current crowding. Additionally, or alternatively, layout features in protection device areas may create one or more re-entrant corners, which in turn may exacerbate the localized current crowding. The localized current crowding may lead to thermal runaway phenomena that tend to permanently damage the protection devices by melting localized regions of the device area. As such, achieving uniform distribution of the current throughout the device area would be beneficial to improve current handling capability of the protection devices.

The present disclosure describes semiconductor devices with high current capability for ESD or surge protection. Such devices (e.g., diodes) may include multiple n-type semiconductor regions in a p-type semiconductor layer. Each of the n-type semiconductor regions may have a footprint with a circular, oval, or obround shape. Moreover, a boundary of the footprint may be spaced apart from an isolation structure that surrounds the p-type semiconductor layer. The n-type semiconductor regions may be coupled to a terminal through individual groups of contacts that are connected to the n-type semiconductor regions, respectively. Additionally, or alternatively, the p-type semiconductor layer surrounded by the isolation structure may not include any re-entrant corner—i.e., the area occupied by the p-type semiconductor layer without an interior angle greater than 180 degrees.

Figure 1B:
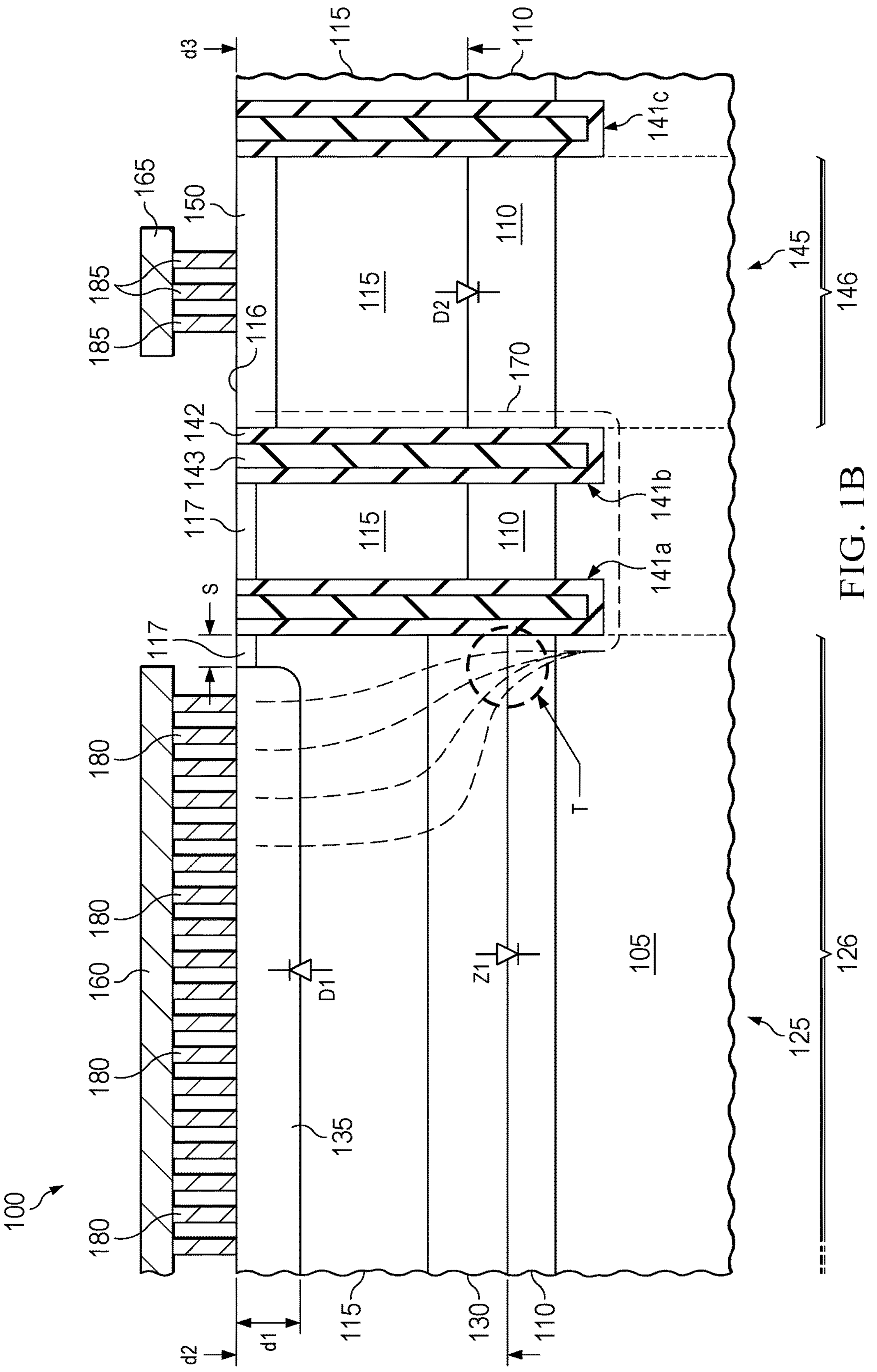

FIGS. 1A and 1B illustrate schematic diagrams of a semiconductor device 100 in accordance with embodiments of the present disclosure. FIG. 1A is a plan view of the semiconductor device 100, which may be regarded as a composite layout of the semiconductor device 100; FIG. 1B is a cross-sectional view of the semiconductor device 100 taken across an imaginary line AA' as marked in FIG. 1A. These figures are described concurrently in the following discussion.

The semiconductor device 100 includes an n-type substrate 105. In some embodiments, the n-type substrate 105 may have an average dopant density (e.g., phosphorus or arsenic concentration) greater than $1\times10^{18}$ $cm^{-3}$. In some embodiments, a dynamic resistance (Ron) of the semiconductor device 100 may depend on the dopant density of the substrate 105—e.g., the greater dopant density, the less Ron. Moreover, current spreading capability during ESD or surge events throughout the semiconductor device 100 may become enhanced with higher dopant concentration of the substrate 105. In some embodiments, the substrate 105 can have an average dopant density exceeding $5\times10^{19}$ $cm^{-3}$. The substrate 105 may be, for example, part of a bulk silicon wafer.

The semiconductor device 100 includes an n-type semiconductor layer 110 (e.g., a crystalline silicon layer) disposed on the substrate 105. In some embodiments, the n-type semiconductor layer 110 has an average dopant density (e.g., phosphorus and/or arsenic concentration) less than $1\times10^{16}$ $cm^{-3}$. As such, the n-type semiconductor layer 110 may be referred to as a lightly doped n-type semiconductor layer—i.e., having a relatively less dopant concentration when compared to the substrate 105. In some embodiments, the n-type semiconductor layer 110 may be 1 to 5 micrometers (μm) thick. The n-type semiconductor layer 110 may be an epitaxial layer formed on the substrate 105.

Additionally, the semiconductor device 100 includes a p-type semiconductor layer 115 disposed over the n-type semiconductor layer 110. The p-type semiconductor layer 115 has a surface 116 facing away from the substrate 105. In some embodiments, the p-type semiconductor layer 115 has an average dopant density (e.g., boron and/or indium concentration) less than $1\times10^{15}$ $cm^{-3}$. As such, the p-type semiconductor layer 115 may be referred to as a lightly doped p-type semiconductor layer. In some embodiments, the p-type semiconductor layer 115 may be 3 to 8 μm thick. The p-type semiconductor layer 115 may be an epitaxial layer formed on the n-type semiconductor layer 110. In some embodiments, the p-type dopant density at or near the surface 116 may be increased greater than the average dopant density. For example, p-type dopant atoms may be added after forming the p-type semiconductor layer 115—e.g., by performing a blanket ion-implantation step after the epitaxial growth process forming the p-type semiconductor layer 115. As a result, the p-type semiconductor layer 115 may include a p-type surface region 117 with the p-type dopant density of approximately $1\times10^{16}$ $cm^{-3}$ or less. The increased dopant density at or near the surface 116 is expected to reduce likelihood of forming a depletion layer at or near the surface 116, which may result from electric charge present in a dielectric layer (e.g., an oxide layer) above the surface 116.

The semiconductor device 100 includes a first diode 125 in a first diode area 126. The first diode area 126 is surrounded by an isolation area 140*a*. The first diode 125 includes a p-type buried region 130 extended from the p-type semiconductor layer 115 toward the substrate 105. The p-type buried region 130 may terminate within the n-type semiconductor layer 110. As such, the p-type buried region 130 may not directly contact the substrate 105.

In some embodiments, the p-type buried region 130 can be formed by performing ion-implantation (i.e., implanting p-type dopant atoms, such as boron and/or indium) in the area corresponding to the first diode 125 after forming the n-type semiconductor layer 110—e.g., after growing an n-type epitaxial layer on the substrate 105. After the ion-implantation step, the p-type semiconductor layer 115 can be formed—e.g., growing a p-type epitaxial layer on the n-type semiconductor layer 110 including the implanted dopant atoms. While the p-type semiconductor layer 115 is being formed (e.g., during the epitaxial growth process forming the p-type semiconductor layer 115), the implanted dopant atoms can spread (e.g., through diffusion process) into the n-type semiconductor layer 110 and into the p-type semiconductor layer 115 as shown in FIG. 1B. In some embodiments, the p-type buried region 130 has a dopant concentration (e.g., boron and/or indium concentration) of at least $1\times10^{17}$ $cm^{-3}$.

The first diode 125 also includes an n-type region 135 extended from the surface 116 toward the substrate 105 and terminated above the p-type buried region 130. As depicted in FIG. 1A, the n-type region 135 occupies substantially the entire first diode area 126 except the space (S denoted in FIGS. 1A/1B) between the n-type region 135 and the isolation area 140*a*. In some embodiments, the p-type semiconductor layer 115 corresponding to the space may include the p-type surface region 117—e.g., as a result of the blanket ion-implantation step performed after forming the p-type semiconductor layer 115. In some embodiments, the n-type region 135 has a dopant concentration (e.g., phosphorus and/or arsenic concentration) of at least $1\times10^{16}$ $cm^{-3}$ or greater. In some embodiments, the n-type region 135 has a graded dopant profile including an inner portion and an outer portion. The n-type region 135 may be separated from the p-type buried region 130 by approximately 2 μm or more. The inner portion may have an average dopant concentration (e.g., phosphorus and/or arsenic concentration) ranging from $1\times10^{17}$ $cm^{-3}$ to $3\times10^{19}$ $cm^{-3}$. The outer portion may have an average dopant concentration (e.g., phosphorus and/or arsenic concentration) ranging from $1\times10^{16}$ $cm^{-3}$ to $1\times10^{17}$ $cm^{-3}$.

The n-type region 135 is in contact with the p-type semiconductor layer 115, which forms a first pn junction (e.g., the diode D1 depicted in FIG. 1B) of the first diode 125. The first pn junction is formed at a first depth (d1 denoted in FIG. 1B) from the surface 116. The first pn junction is expected to form a relatively wide depletion region under a reverse bias condition (e.g., during normal operations of a device under protection (DUP) coupled with the semiconductor device 100), for example, in view of the first pn junction formed across the n-type region 135 (or the outer portion of the n-type region 135 in some embodiments) and the lightly doped p-type semiconductor layer 115. The wide depletion region is expected to provide relatively low capacitance coupled to the DUP, which may be advantageous to maintain the integrity of signals that the DUP manages. Accordingly, the first diode 125 may be referred to as a low capacitance (LC) diode.

As depicted in FIG. 1B, the p-type buried region 130 may have an interface contacting the n-type semiconductor layer 110. The interface between the p-type buried region 130 and the n-type semiconductor layer 110 forms a second pn junction (e.g., the diode Z1 depicted in FIG. 1B) of the first diode 125. The second pn junction is formed at a second depth (d2 denoted in FIG. 1B) from the surface 116, which is greater than the first depth. As such, a portion of the p-type semiconductor layer 115 located between the first and second pn junctions forms a common anode for the first and second pn junctions—e.g., a common anode for the diode D1 and the diode Z1. In this manner, the first diode 125 may include a back-to-back D1-Z1 diode that the diode D1 and the diode Z1 forms.

The second pn junction (the diode Z1) can be configured to breakdown under a reverse bias condition (e.g., at a reverse bias breakdown voltage) to conduct current—e.g., avalanche current during ESD or surge events. The reverse bias breakdown voltage may be related to working voltages of the protection devices, which can be determined to be less than the reverse bias breakdown voltage. The working voltages of the protection devices may be regarded as a parameter to consider in selecting a proper protection device based on operating conditions of the DUP. For example, the signals that the DUP handles may not exceed the working voltage of the protection device. In other words, the protection devices with greater reverse bias breakdown voltages (i.e., greater working voltages) can provide protection for the DUPs handling greater signal voltage ranges.

The semiconductor device 100 includes a second diode 145 in a second diode area 146. The second diode area 146 is surrounded by an isolation area 140*b*. The second diode 145 includes a p-type region 150 extended from the surface 116 toward the substrate 105. The p-type region 150 terminates within the p-type semiconductor layer 115. In some embodiments, the p-type region 150 has a dopant concentration (e.g., boron and/or indium concentration) of at least $1\times10^{17}$ $cm^{3}$. The second diode 145 includes a third pn junction (e.g., the diode D2 depicted in FIG. 1B), which is formed across the p-type semiconductor layer 115 and the n-type semiconductor layer 110. The third pn junction is formed at a third depth (d3 denoted in FIG. 1B) from the surface 116, which is greater than the first depth (d1) and less than the second depth (d2).

The n-type region 135 of the first diode 125 is connected to contacts 180 that are coupled to a terminal 160 (a first conductive structure). Similarly, the p-type region 150 of the second diode 145 is connected to contacts 185 that are coupled to a terminal 165 (a second conductive structure). The n-type substrate 105 provides a common terminal for both the first diode 125 and the second diode 145. The first diode 125 may be regarded as an open-base npn bipolar transistor including the n-type region 135 (emitter), the p-type layer 115 and the p-type buried region 130 (base), and the n-type layer 110 (collector). The emitter is connected to the terminal 160, and the collector is connected to the n-type substrate 105 that is coupled to the second diode 145, which is in turn, connected to the terminal 165.

As described above, the semiconductor device 100 includes the isolation areas 140 (also identified individually as isolation areas 140*a* and 140*b* in FIG. 1A)—e.g., the isolation area 140*a* surrounding the first diode 125 (or the first diode area 126), the isolation area 140*b* surrounding the second diode 145 (or the second diode area 146). The isolation areas 140 include isolation structures 141 (also identified individually as isolation structures 141*a* through 141*c* depicted in FIG. 1B). The isolation structures 141 extend from the surface 116 past an interface between the n-type semiconductor layer 110 and the substrate 105. Moreover, the semiconductor device 100 may include another isolation area 190 that surrounds both the first diode 125 (and the isolation area 140*a*) and the second diode 145 (and the isolation area 140*b*). The isolation area 190 may be referred to as a termination isolation area for the semiconductor device 100. In some embodiments, the isolation area 190 includes isolation structures formed concurrently with the isolation structures 141.

In some embodiments, the isolation structures 141 can be formed by trench isolation techniques. For example, the isolation structures 141 may be formed by etching trenches through the p-type semiconductor layer 115 (and the p-type buried region 130 of the first diode 125), the n-type semiconductor layer 110, and into the substrate 105. Depths of the trenches may range from 5 to 15 μm, or even greater (e.g., 20 μm). Accordingly, the isolation areas 140 may be referred to as deep trench isolation (DTI) areas. Similarly, the isolation structures 141 may be referred to as trench isolation structures, DTI structures, or dielectric isolation structures. In some embodiments, the isolation structures 141 include a dielectric liner 142 formed on the trench surface (e.g., sidewall and bottom of the trench) and a conductive material 143 (e.g., poly-silicon) formed on the dielectric liner 142. The conductive material may be dielectrically isolated from other structures (or components) outside the isolation structure 141.

In some embodiments, the isolation structures 141 can be formed after forming the n-type region 135 and/or the p-type region 150 in the p-type semiconductor layer 115. For example, after forming the p-type semiconductor layer 115 (e.g., by forming the p-type epitaxial layer on the n-type semiconductor layer 110), photolithography steps can define the n-type region 135 (or the p-type region 150) followed by ion-implantation steps to introduce n-type dopant atoms for the n-type region 135 (or p-type dopant atoms for the p-type region 150) Subsequently, the isolation structures 141 can be formed as described above—e.g., etching the trench into the substrate 105, forming the dielectric liner 142, and forming the conductive material 143 on the dielectric liner 142.

In other embodiments, the isolation structures 141 can be formed before forming the n-type region 135 and/or the p-type region 150 in the p-type semiconductor layer 115. For example, the isolation structures 141 can be formed as described above after forming the p-type semiconductor layer 115 (e.g., by forming the p-type epitaxial layer on the n-type semiconductor layer 110). Subsequently, photolithography steps can define the n-type region 135 (or the p-type region 150) followed by ion-implantation steps to introduce n-type dopant atoms for the n-type region 135 (or p-type dopant atoms for the p-type region 150) to form the n-type region 135 and the p-type region 150.

During operation of the semiconductor device 100 (e.g., during ESD or surge events), the second diode 145 may be forward biased—e.g., the terminal 165 at a greater voltage than the terminal 160. When the Z1 diode of the first diode 125 undergoes avalanche breakdown, current 170 flows between the terminals 160 and 165, thereby "clamping" the voltage difference between the first and second terminals to protect the DUP coupled to the semiconductor device 100.

Without being bound by the theory, as the current 170 tends to take shorter paths to flow between the terminals 160 and 165, the current 170 may start to flow in a portion of the first diode 125 generally close to the second diode 145. Such uneven distribution of the current 170 may be exacerbated in view of a portion of the second pn junction adjacent to the isolation structure (indicated with a circle T in FIG. 1B), which may be regarded to have a lower breakdown voltage than other portion of the second pn junction. The lower breakdown voltage may be a result of greater impact ionization occurring adjacent to the isolation structure, which may be attributable to the dielectric liner 142 sustaining part of the ESD (or surge) voltage capacitively coupled to the conductive material 143 (e.g., poly-silicon). In other words, the portion of the second pn junction adjacent to the isolation structure may experience the avalanche breakdown ahead of the other portion of the second pn junction.

Once the portion of the second pn junction adjacent to the isolation structure "turns on" (undergoing avalanche breakdown), the portion tends to remain "on" (or to become even more conductive) as the other portions of the second pn junction "turns on" (undergoing avalanche breakdown) to participate in dissipating the current 170 throughout the first diode 125. As such, although the contacts 180 distributed across the n-type region 135 may establish constant electric potential throughout the n-type region 135, the current conduction in the first diode 125 may not be evenly distributed. FIG. 1A depicts a "hot" region H of the n-type region 135, which is located relatively closer to the p-type region 150 than a "cold" region C of the n-type region 135. In other words, the region H may be expected to conduct more avalanche current than the region C during the operation of the semiconductor device 100.

Moreover, the first diode area 126 includes a re-entrant corner R as indicated in FIG. 1A. The re-entrant corner R corresponds to a portion of the first diode area 126 with an interior angle greater than 180 degrees. Without being bound by the theory, the curved profile of the first diode area 126 (or of the n-type region 135) at the re-entrant corner R may cause electric field to concentrate there, which may lead to "hot spots" to develop at the re-entrant corner. Accordingly, the re-entrant corner R may worsen the uneven distribution of the avalanche current conduction during the operation of the semiconductor device 100, which may result in premature failures at lower ESD ratings than expected.

Figure 2A:
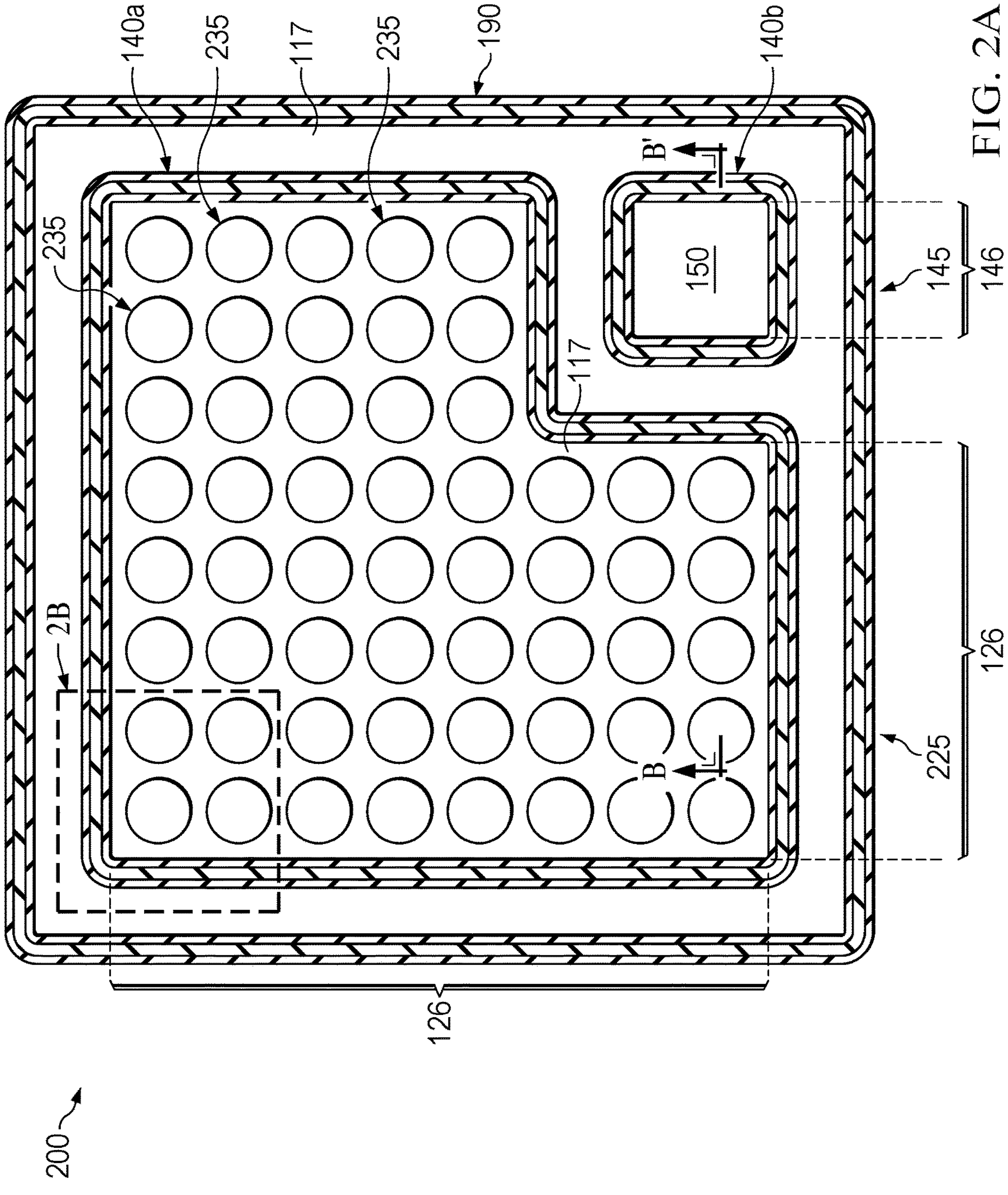
FIGS. 2A through 2C illustrate schematic diagrams of a semiconductor device in plan and cross-sectional views in accordance with embodiments of the present disclosure.
Figure 2B:
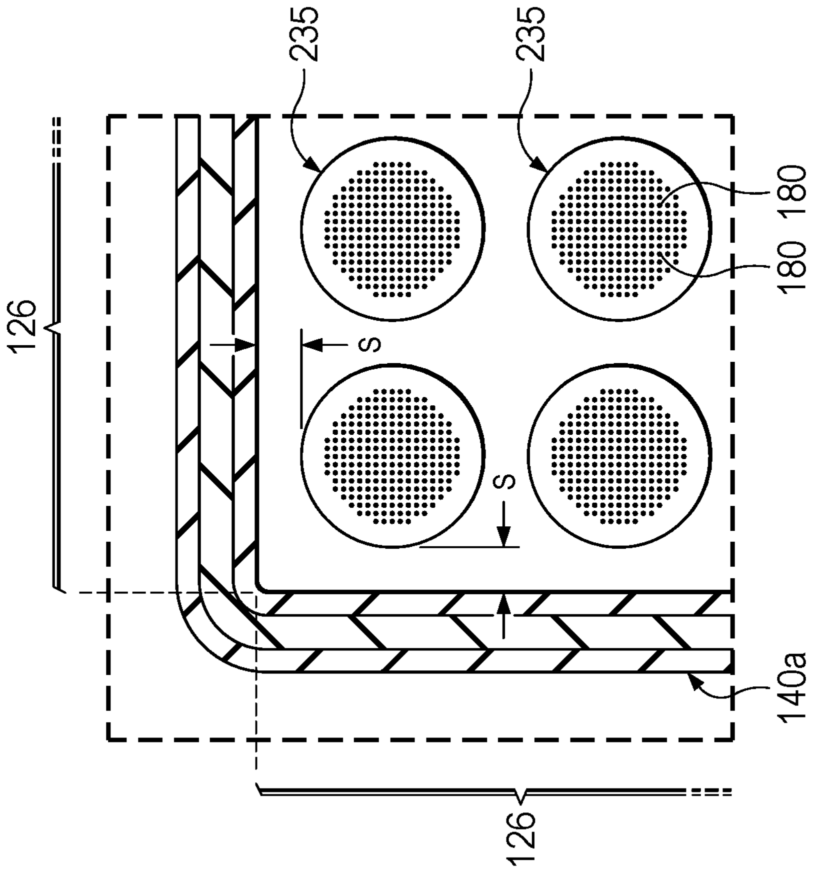
Figure 2C:
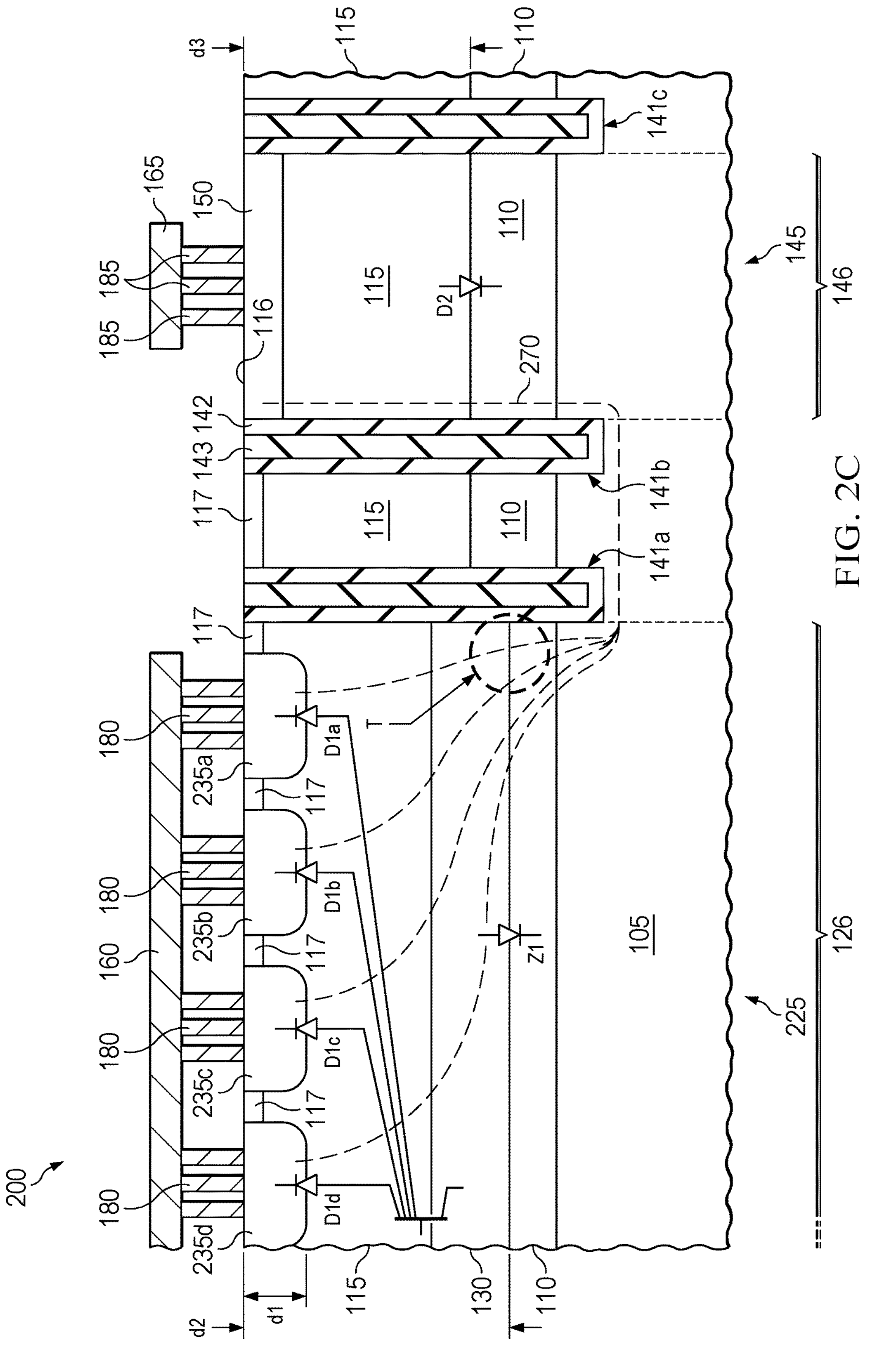

FIGS. 2A through 2C illustrate schematic diagrams of a semiconductor device 200 in accordance with embodiments of the present disclosure. FIGS. 2A and 2B are plan views of the semiconductor device 200, which may be regarded as composite layouts of the semiconductor device 200; FIG. 2C is a cross-sectional view of the semiconductor device 200 taken across an imaginary line BB' as marked in FIG. 2A. The semiconductor device 200 is generally similar to the semiconductor device 100 described with reference to FIGS. 1A and 1B, and therefore like reference numbers refer to like components in FIGS. 1A and 1B. FIGS. 2A through 2C are described concurrently in the following discussion.

The semiconductor device 200 includes a first diode 225 (e.g., LC diode) in the first diode area 126. The first diode 225 includes multiple n-type regions 235 (also identified individually as n-type regions 235*a* through 235*d* in FIG. 2C) distributed within the first diode area 126. The first diode 225 may be regarded the same as the first diode 125 except the solid n-type region 135 replaced with the multiple n-type regions 235 (which may also be referred to as a multi-fingered, partitioned, split, or distributed n-type region). In some embodiments, individual n-type regions 235 may include a graded dopant profile with an inner portion and an outer portion similar to the graded dopant profile of the n-type region 135 described with reference to FIGS. 1A/1B.

In some embodiments, the p-type semiconductor layer 115 corresponding to the spaces between individual n-type regions 235 (and the space between the n-type regions 235 and the isolation area 140*a* as denoted S in FIG. 2B) may include the p-type surface region 117—e.g., as a result of the blanket ion-implantation step performed after forming the p-type semiconductor layer 115. The increased dopant density of the p-type surface regions 117 at or near the surface 116 is expected to reduce likelihood of forming a depletion layer at or near the surface 116, which may result from electric charge that may be present in a dielectric layer (e.g., an oxide layer) above the surface 116. Such a depletion layer, if formed, may increase the capacitance of the semiconductor device 200—e.g., the capacitance associated with the first diode 225.

Each one of the multiple n-type regions 235 has a horizontal cross-sectional area parallel to the surface 116 of the p-type semiconductor layer 115 (e.g., a footprint) with a shape of a circle as depicted in FIGS. 2A/2B. In some embodiments, the footprint may be an oval or obround shape. Such a shape of the individual n-type regions 235 may be suitable to avoid sharp corners in the n-type regions 235—e.g., to avoid electric field being concentrated at the sharp corners. Additionally, boundaries of the footprints are spaced apart from an isolation structure (e.g., the isolation structure 141*a*).

Each one of the multiple n-type semiconductor regions 235 is connected to a group of contacts 180 as shown in FIGS. 2B/2C. FIG. 2B illustrates that overall distribution of the contacts 180 within each n-type semiconductor region 235 (e.g., a contour or an outline of the contacts 180 in the n-type semiconductor region 235) may resemble the shape of the footprint of the n-type semiconductor region 235—e.g., a circular, oval, or obround shape. Moreover, individual groups of the contacts 180 connected to the n-type semiconductor regions 235 are connected to each other. In other words, the multiple n-type regions 235 are configured to couple to a terminal or a first conductive structure (e.g., the terminal 160) through the groups of contacts 180.

The multiple n-type semiconductor regions 235 form multiple first pn junctions (also identified individually as diodes D1a through D1d in FIG. 2C) at the first depth (denoted as d1 in FIG. 2C) from the surface 116 of the p-type semiconductor layer 115. The first diode 225 may be regarded as an open-base npn bipolar transistor including the multiple n-type semiconductor regions 235 (multi-fingered emitter), the p-type layer 115 and the p-type buried layer 130 (base), and the n-type layer 110 (collector). The multi-fingered emitter is connected to the terminal 160, and the collector is connected to the n-type substrate 105 that is coupled the second diode 145, which is in turn, connected to another terminal or a second conductive structure (e.g., the terminal 165).

During operation of the semiconductor device 200 (e.g., during ESD or surge events), the second diode 145 of the semiconductor device 200 may be forward biased, and when the Z1 diode of the first diode 225 undergoes the avalanche breakdown, current 270 flows between the terminal 160 and the terminal 165 to protect the DUP coupled to the semiconductor device 200. As with the operation of the semiconductor device 100, the portions of the second pn junction located proximate to the isolation structure (e.g., the portion of the second pn junction within the circle T) may experience the avalanche breakdown ahead of the other portions of the second pn junction. The multiple n-type regions 235, however, are expected to facilitate the other portions of the second pn junction participating (e.g., turning on via avalanche breakdown) in dissipating the current 270 throughout the first diode area 126—namely, spreading the current 270 across the first diode area 126. The spreading of the current 270 (e.g., when compared to the current 170) may be attributable to the multiple n-type regions 235 that tend to force the current 270 to flow through discrete parts of the second diode 225, which correspond to the multiple n-type regions 235 as schematically indicated by the branches in the current 270.

Accordingly, the first diode 225 (the multi-fingered open-base npn bipolar transistor) may be considered to have a relatively uniform current gain (also known as $h_{fe}$ or amplification factor) throughout the first diode area 126. The first diode 225 is also expected to have a relatively greater collector area (e.g., greater area of the n-type semiconductor layer 110 and/or the n-type semiconductor substrate 105) for the current conduction when compared to the semiconductor device 100—e.g., as a result of the current 270 spread in a wider region of the first diode area 126 when compared to the semiconductor device 100. Thus, the semiconductor device 200 is expected to safely dissipate a greater amount of avalanche current when compared to the semiconductor device 100. For example, the semiconductor device 200 has shown about 15% greater current handling capability than the semiconductor device 100, which resulted in about 25% greater ESD ratings. Moreover, the first diode 225 is expected to have a less capacitance than the first diode 125 in view of the reduced area occupied by the multiple n-type semiconductor regions 235 when the first diode area 126 remains the same between the semiconductor device 100 and the semiconductor device 200.

The foregoing example embodiments described with reference to FIGS. 1A through 2C illustrate overall features and the principles of the present disclosure, and it should be understood the present disclosure is not limited thereto. For example, although the semiconductor device 200 is illustrated with the first diode area 126 and the second diode area 146, each of which is separately surrounded by the isolation areas 140*a* and 140*b*, respectively, in some embodiments, the isolation areas 140*a* and 140*b* may be merged together—e.g., the isolation structures 141*a* and 141*b* of FIG. 2C merged together.

In some embodiments, the p-type buried region 130 of the first diode 225 may directly contact the substrate 105. In other words, the p-type buried region 130 may extend from the p-type semiconductor layer 115 all the way to the substrate 105 such that the p-type semiconductor layer 115 can be in direct contact with the substrate 105. In such embodiments, the isolation structures 141 may extend past an interface between the p-type buried region 130 and the substrate 105. In some embodiments, the first diode 225 (without the second diode 145) may be used as a protection device against ESD (or surge) events.

Figure 3:
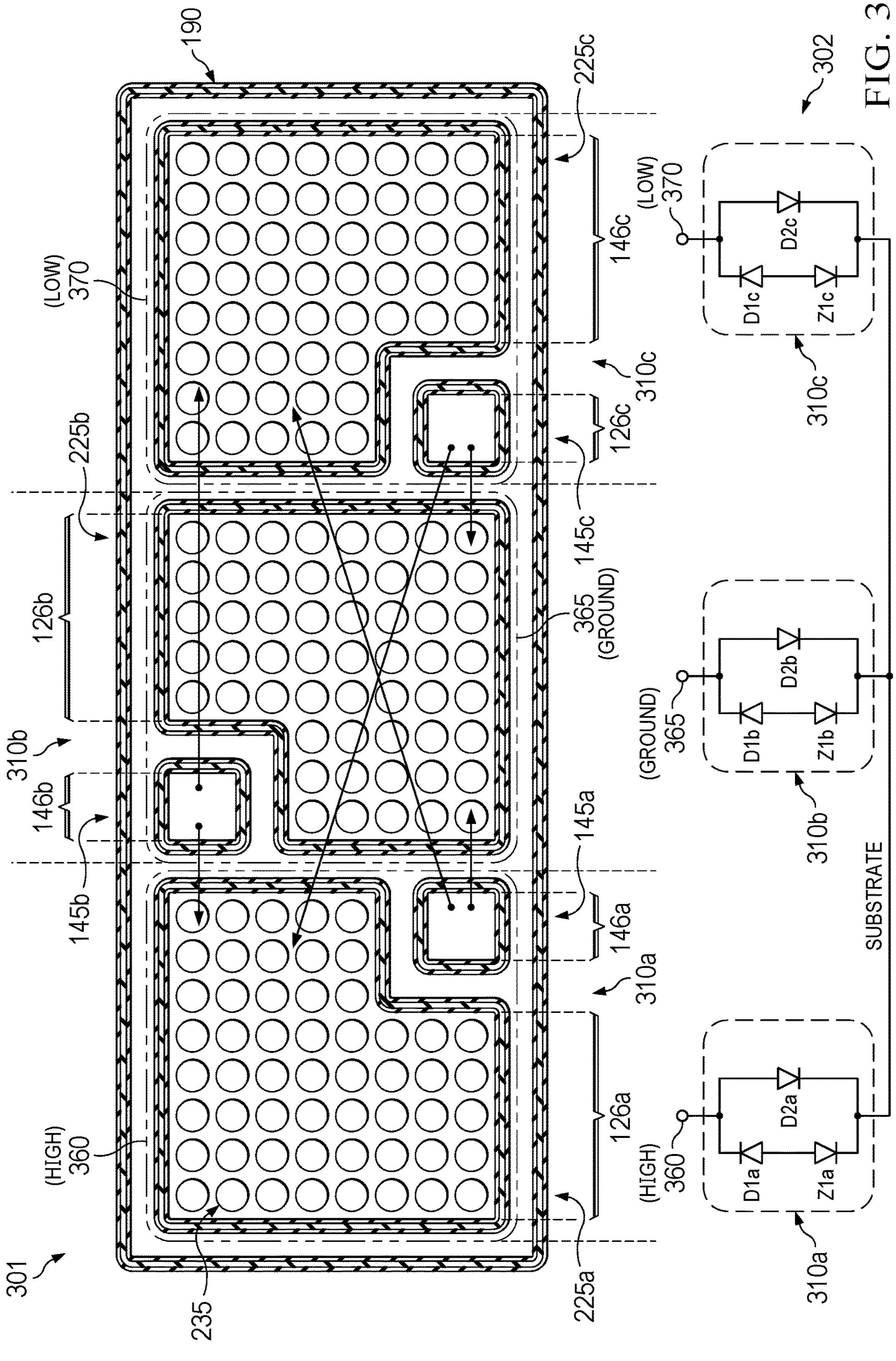
FIG. 3 illustrates a schematic diagram and an equivalent circuit diagram of a semiconductor device in accordance with embodiments of the present disclosure.

FIG. 3 illustrates a schematic diagram of a semiconductor device 301 in accordance with embodiments of the present disclosure, which may be regarded as a composite layout of the semiconductor device 301. The semiconductor device 301 is generally similar to the semiconductor device 200 described with reference to FIGS. 2A through 2C, and therefore like reference numbers refer to like components of FIGS. 2A through 2C. Also illustrated in FIG. 3 is an equivalent circuit diagram 302 of the semiconductor device 301. The semiconductor device 301 includes three channels 310 (also identified individually as channels 310*a* through 310*c*), which may also be referred to as unit cells of the semiconductor device 301. The semiconductor device 301 includes a termination isolation area (e.g., the terminal isolation area 190) that surrounds the channels 310.

Each of the channels 310 includes the first diode 225 (also identified individually as first diodes 225*a* through 225*c*) and the second diode 145 (also identified individually as second diodes 145*a* through 145*c*). Moreover, the multiple n-type semiconductor regions 235 of the first diode 225 and the p-type region 150 of the second diode 145 are coupled to each other—namely, the terminal 160 of the first diode 225 and the terminal 165 of the second diode 145 are connected to each other, thereby forming a terminal for the channel 310—e.g., the terminal 360, 365, or 370 described below. In this manner, individual channels (or unit cells) 310 may be regarded as having two terminals, namely a first terminal connected to both the terminal 160 and the terminal 165 and a second terminal corresponding to the n-type substrate 105 that is common to both the first diode 225 and the second diode 145. As such, individual channels 310 may be regarded as bidirectional diodes that each includes the first diode 225 and the second diode 145 connected in parallel as shown in the circuit diagram 302. In some embodiments, the first diode 225 may be referred to as a LC diode, and the second diode 145 may be referred to as a parallel diode. Similarly, the first diode area 226 may be referred to as an LC diode area, and the second diode area 146 may be referred to as a parallel diode area.

For example, the channel 310*a* includes the first diode 225*a* (i.e., D1a-Z1a diode) and the second diode 145*a* (i.e., D2a diode) connected in parallel. In this regard, the multi-fingered n-type regions 235 of the first diode 225*a* and the p-type region 150 of the second diode 145*a* are connected to the terminal 360 (denoted as HIGH terminal). Moreover, the n-type semiconductor layer 110 (i.e., cathode of the Z1a diode and cathode of the D2a diode) is connected to the n-type substrate 105. Similarly, the channel 310*b* includes the first diode 225*b* (i.e., D1b-Z1b diode) and the second diode 145*b* (i.e., D2b diode) connected in parallel, and the channel 310*c* includes the first diode 225*c* (i.e., D1c-Z1c diode) and the second diode 145*c* (i.e., D2c diode) connected in parallel. The channel 310*b* is connected to the terminal 365 (denoted as GROUND terminal) and the channel 310*c* is connected to the terminal 370 (denoted as LOW terminal). Each of the terminals 360, 365, and 370 may be a conductive structure (e.g., a metallic pad) disposed over the first diode 225 and the second diode 145, which is connected to the terminal 160 and the terminal 165 of the respective channels 310. As shown in the circuit diagram 302, the n-type substrate 105 provides a shared terminal for the three channels 310*a*, 310*b*, and 310*c*.

The current conduction scheme described with reference to FIG. 2C applies between the unit cells of the semiconductor device 301. In other words, during operation of the semiconductor device 301, the second diode 145 of a channel "supplies (drives)" the current to the first diode 225 of another channel. By way of example, during a first ESD event with a first polarity between the HIGH and GROUND terminals (e.g., forward biasing the second diode 145*a*), the avalanche current flows between the second diode 145*a* (connected to the HIGH terminal) and the first diode 225*b* (connected to the GROUND terminal). The avalanche current is indicated with an arrow originating from the second diode 145*a* (with a circled end) and terminating at the first diode 225*b* (with a pointed end). In this regard, the second pn junction (i.e., Z1 b diode) of the first diode 225*b* breaks down to flow (dissipate, shunt) the current to the GROUND terminal.

Similarly, during a second ESD event with a second polarity between the HIGH and GROUND terminals, which is opposite to the first polarity (e.g., forward biasing the second diode 145*b*), the avalanche current flows between the second diode 145*b* (connected to the GROUND terminal) and the first diode 225*a* (connected to the HIGH terminal). The second pn junction (i.e., Z1a diode) of the first diode 225*a* breaks down to flow the current to the HIGH terminal. The avalanche current is indicated with an arrow originating from the second diode 145*b* (with a circled end) and terminating at the first diode 225*a* (with a pointed end). Different ESD events (and corresponding conduction of avalanche current) between the GROUND and LOW terminals, as well as the HIGH and LOW terminals are indicated by additional arrows in FIG. 3.

As used herein, the arrows indicate representative current flow between components (e.g., first diodes 225, second diodes 145) of the channels (e.g., channels 310 of the semiconductor device 301). Moreover, different lengths of the arrows may generally correspond to different lateral distances that the avalanche current travels—e.g., in the n-type substrate 105 provided that the vertical distances that the avalanche current travels are approximately the same among different ESD events. In some embodiments, the lateral distance that the avalanche current travels may be related to (e.g., proportional to) various electrical characteristics of the semiconductor device 301 during its operation—e.g., dynamic resistance (Ron), amount of current that can be safely dissipated (It2). For example, in some embodiments, the longer the distance for the avalanche current to travel may result in the greater amount of current that can be safely dissipated (e.g., greater It2) at least partially due to spreading of the avalanche current throughout a wider area of the n-type substrate 105.

Figure 4A:
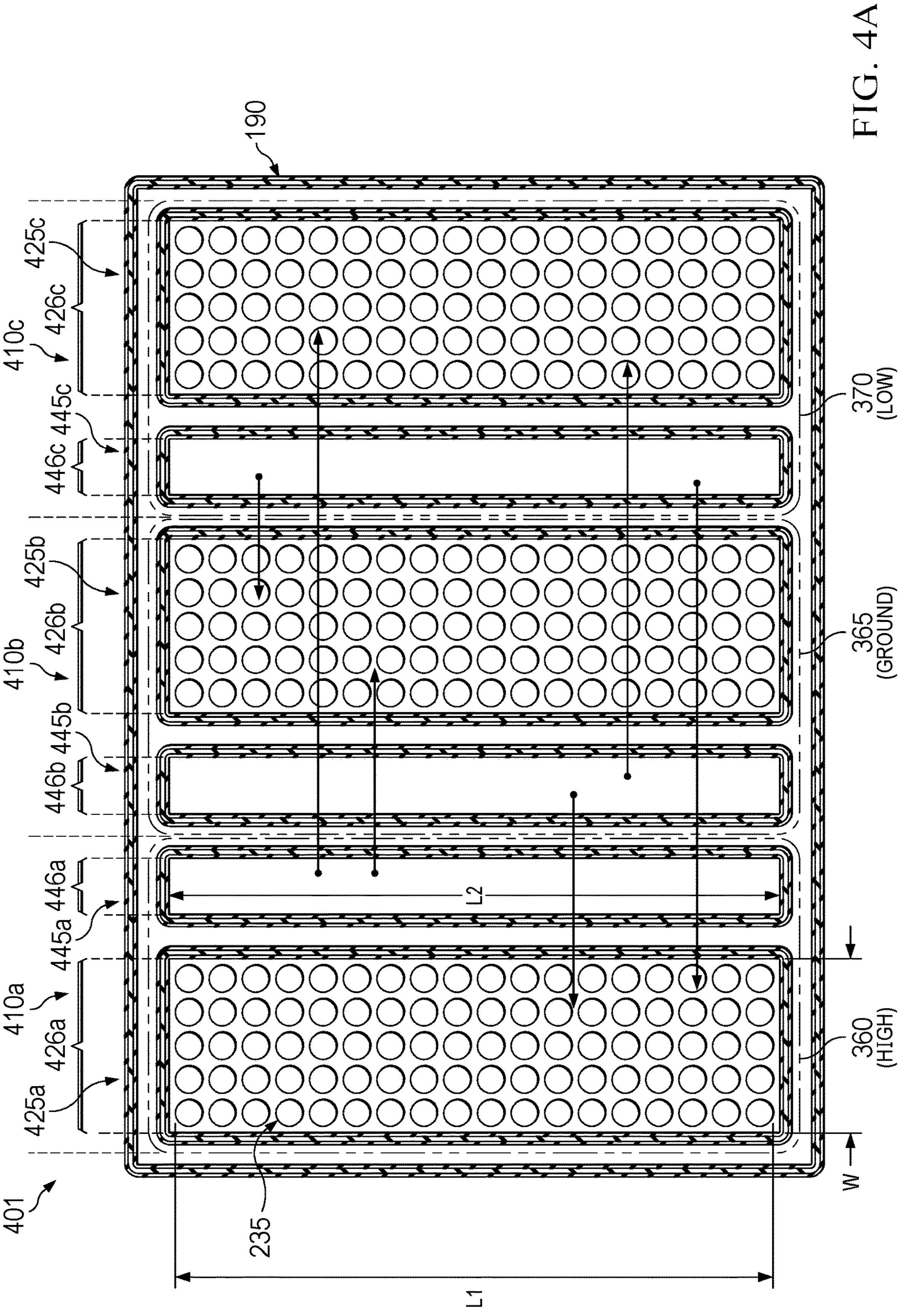
FIGS. 4A and 4B illustrate schematic diagrams of semiconductor devices in accordance with embodiments of the present disclosure.
Figure 4B:
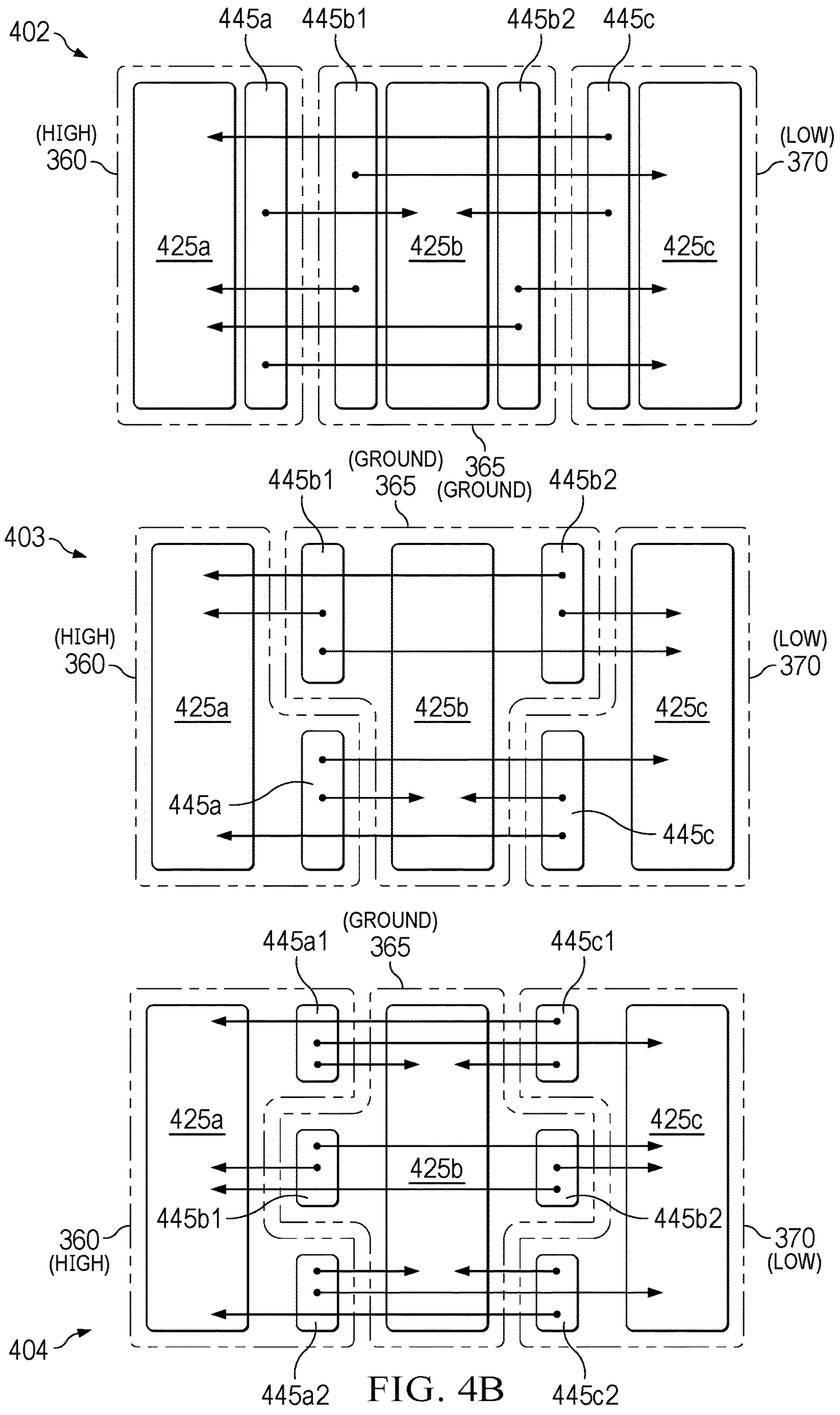

FIGS. 4A and 4B illustrate schematic diagrams of semiconductor devices 401 through 404 in accordance with embodiments of the present disclosure, which may be regarded as composite layouts of the semiconductor devices. The semiconductor devices 401 through 404 are generally similar to the semiconductor device 301 described with reference to FIG. 3, and therefore like reference numbers refer to like components of FIG. 3.

Each of the semiconductor devices 401 through 404 includes three channels 410 (also identified individually as channels 410*a* through 410*c* depicted in FIG. 4A). As with the channels 310 of the semiconductor device 301, the channels 410 includes a first diode 425 and a second diode 445 connected in parallel. Each of the first diodes 425 and the second diodes 445 are surrounded by respective isolation areas, and a termination isolation area surrounds the three channels 410. Also, the first diodes 425 include the multi-fingered n-type regions 235. The schematic diagrams of semiconductor devices 402 through 404 illustrated in FIG. 4B omit certain features when compared to the semiconductor device 401 illustrated in FIG. 4A. For example, the isolation areas and the multi-fingered n-type regions are omitted in FIG. 4B to clearly describe overall features and the principles of the present disclosure.

The equivalent circuit diagram 302 described with reference to FIG. 3 applies to the semiconductor devices 401 through 404, respectively. For example, each channel 410 includes a first diode 425 and a second diode 445 connected in parallel. As with the semiconductor device 301, the three channels 410*a* through 410*c* are connected to terminals 360, 365, and 370 (i.e., HIGH, GROUND, and LOW terminals), respectively. The substrate 105 provides a common or shared node for the three channels 410*a* through 410*c*. As such, the current conduction schemes described with reference to FIG. 3 apply to the semiconductor devices 401 through 404.

For example, during a first ESD event with a first polarity between the HIGH and GROUND terminals (e.g., forward biasing the second diode 445*a*), the avalanche current flows between the second diode 445*a* (connected to the HIGH terminal) and the first diode 425*b* (connected to the GROUND terminal). The avalanche current is indicated with an arrow originating from the second diode 445*a* (with a circled end) and terminating at the first diode 425*b* (with a pointed end). In this regard, the second pn junction (i.e., Z1 b diode) of the first diode 425*b* breaks down to flow (dissipate, shunt) the current to the GROUND terminal.

Similarly, during a second ESD event with a second polarity between the HIGH and GROUND terminals, which is opposite to the first polarity (e.g., forward biasing the second diode 445*b*), the avalanche current flows between the second diode 445*b* (connected to the GROUND terminal) and the first diode 425*a* (connected to the HIGH terminal). The second pn junction (i.e., Z1a diode) of the first diode 425*a* breaks down to flow the current to the HIGH terminal. The avalanche current is indicated with an arrow originating from the second diode 445*b* (with a circled end) and terminating at the first diode 425*a* (with a pointed end). Different ESD events (and corresponding conduction of avalanche current) between the GROUND and LOW terminals, as well as the HIGH and LOW terminals are indicated by additional arrows in FIG. 4A.

The first diodes 425 may be regarded generally the same as the first diodes 225 except that the first diode areas 426 corresponding to the first diodes 425 do not include any re-entrant corners. In other words, all the interior angles of the first diode areas 426 are less than 180 degrees. Moreover, the first diodes 425 include the multi-fingered n-type regions 235 distributed throughout the first diode area 426—e.g., the multi-fingered n-type regions 235 across a length (denoted as L1 in FIG. 4A) of the first diode area 426 facing the second diode area 446. The length may be approximately same as the corresponding length of the first diode area 426 except the spacing between the isolation area and the n-type regions 235 located immediately next to the isolation area along the length.

The second diodes 445 may be regarded generally the same as the second diodes 145 except that the second diode areas 446 corresponding to the second diodes 445 have a length (denoted as L2 in FIG. 4A) at a side facing the first diode area 426, which is approximately the same as the length L1 of the first diode area 426. The lengths L1 and L2 may be generally perpendicular to the lateral direction of the avalanche current flowing between the first diode 425 and the second diode 445. In this manner, during operation of the semiconductor device 401, the avalanche current conduction between the second diode 445 of one channel (e.g., channel 410*a*) and the first diodes 425 of another channel (e.g., channel 410*b*) can be configured to flow in generally one direction without having to spread out in different directions. In other words, the avalanche current paths are parallel to each other across approximately the entire length (L1 or L2) of the first diode 425 and the second diode 445. The parallel current paths may facilitate reducing the localized current crowding phenomena.

Although the first diodes 225 of the semiconductor device 301 includes the multi-fingered n-type regions 235 that are expected to mitigate the risk of avalanche current crowding to a certain degree, the first diodes 225 (i.e., the first diode areas 226) include re-entrant corners (e.g., the re-entrant corner R described with reference to FIG. 1A) that may render the semiconductor device 301 somewhat vulnerable to the risk of avalanche current crowing. Contrary to the first diodes 225, the first diodes 425 (i.e., the first diode areas 426) do not include any re-entrance corners to avoid electric field concentrating at the re-entrant corners. Moreover, the width (W denoted in FIG. 4A) of the first diodes 425 can be determined to avoid a "cold" region in the first diode area 426—e.g., the cold regions C of the n-type regions 135 as described with reference to FIG. 1A. Thus, the semiconductor device 401 is expected to safely dissipate a greater amount of avalanche current when compared to the semiconductor device 301. For example, the semiconductor device 401 has shown about 20% greater current handling capability (e.g., It2) than the semiconductor device 301.

The semiconductor device 402 depicted in FIG. 4B may be regarded as a variation of the semiconductor device 401 described herein. For example, the channel 410*b* connected to the GROUND terminal 365 is modified to include two second diodes 445*b*1 and 445*b*2, each of which are located next to the channel 410*a* connected to the HIGH terminal 360 and the channel 410*c* connected to the LOW terminal 370, respectively. In this manner, the second diodes 445*b*1 and 445*b*2 may facilitate the avalanche current to travel to the first diode 425*a* (e.g., during the ESD events between the HIGH terminal 360 and the GROUND terminal 365) and to the first diode 425*c* (e.g., during the ESD events between the LOW terminal 370 and the GROUND terminal 365) in an approximately equal lateral distance. As such, the semiconductor device 402 may be expected to have more symmetrical electrical characteristics (e.g., Ron, It2) when compared to the semiconductor device 401. For example, the semiconductor device 402 is expected to have the avalanche current handling capability symmetrical to both polarities of the ESD events (e.g., between HIGH and GROUND terminals, between LOW and GROUND terminals, between HIGH and LOW terminals). Various conduction paths of avalanche current associated with ESD events among the HIGH, GROUND, and LOW terminals are indicated as arrows in the semiconductor device 402 diagram.

The semiconductor device 403 depicted in FIG. 4B may be regarded as a variation of the semiconductor device 401 (or the semiconductor device 402) described herein. The semiconductor device 403 has the area between the first diodes 425*a* and 425*b* (and between the first diodes 425*b* and 425*c*) divided into two halves such that second diodes 445*b*1 and 445*a* (and the second diodes 445*b*2 and 445*c*) can be located in the area. In other words, two second diodes (e.g., second diodes 445*a* and 445*b*1, second diodes 445*b*2 and 445*c*) can be reduced in size (e.g., having a shorter length than the first diodes 425) such that two second diodes can be stacked along the length direction in the area between the first diodes to reduce the total area of the semiconductor device 402—e.g., when compared to the semiconductor device 402 (or the semiconductor device 401).

The semiconductor device 403 includes the channel 410*a* connected to the HIGH terminal 360, which has the first diode 425*a* and the second diode 445*a*. The channel 410*b* of the semiconductor device 403 is connected to the GROUND terminal 365, and includes the first diode 425*b* and the second diodes 445*b*1 and 445*b*2 positioned at each side of the first diode 425*b* facing the first diode 425*a* and the first diode 425*c*, respectively. The channel 410*c* of the semiconductor device 403 is connected to the LOW terminal 370, and includes the first diode 425*c* and the second diode 445*c*. Various conduction paths of avalanche current associated with ESD events among the HIGH, GROUND, and LOW terminals are indicated as arrows in the semiconductor device 403 diagram.

The semiconductor device 404 depicted in FIG. 4B may be regarded as another variation of the semiconductor device 401 (or the semiconductor devices 402) described herein. The semiconductor device 404 illustrates that the second diodes 445 can be further segmented. Namely, the semiconductor device 404 has the area between the first diodes 425*a* and 425*b* (and between the first diodes 425*b* and 425*c*) divided into three regions such that second diodes 445*a*1, 445*a*2, and 445*b*1 (and the second diodes 445*c*1, 445*c*2, and 445*b*2) can be located in the area.

The semiconductor device 404 includes the channel 410*a* connected to the HIGH terminal 360, which includes the first diode 425*a* and the second diodes 445*a*1 and 445*a*2. The channel 410*b* of the semiconductor device 404 is connected to the GROUND terminal 365, and includes the first diode 425*b* and the second diodes 445*b*1 and 445*b*2 positioned at each side of the first diode 425*b* facing the first diode 425*a* and the first diode 425*c*, respectively. The channel 410*c* of the semiconductor device 404 is connected to the LOW terminal 370, and includes the first diode 425*c* and the second diodes 445*c*1 and 445*c*2. Various conduction paths of avalanche current associated with ESD events among the HIGH, GROUND, and LOW terminals are indicated as arrows in the semiconductor device 404 diagram.

Figure 5A:
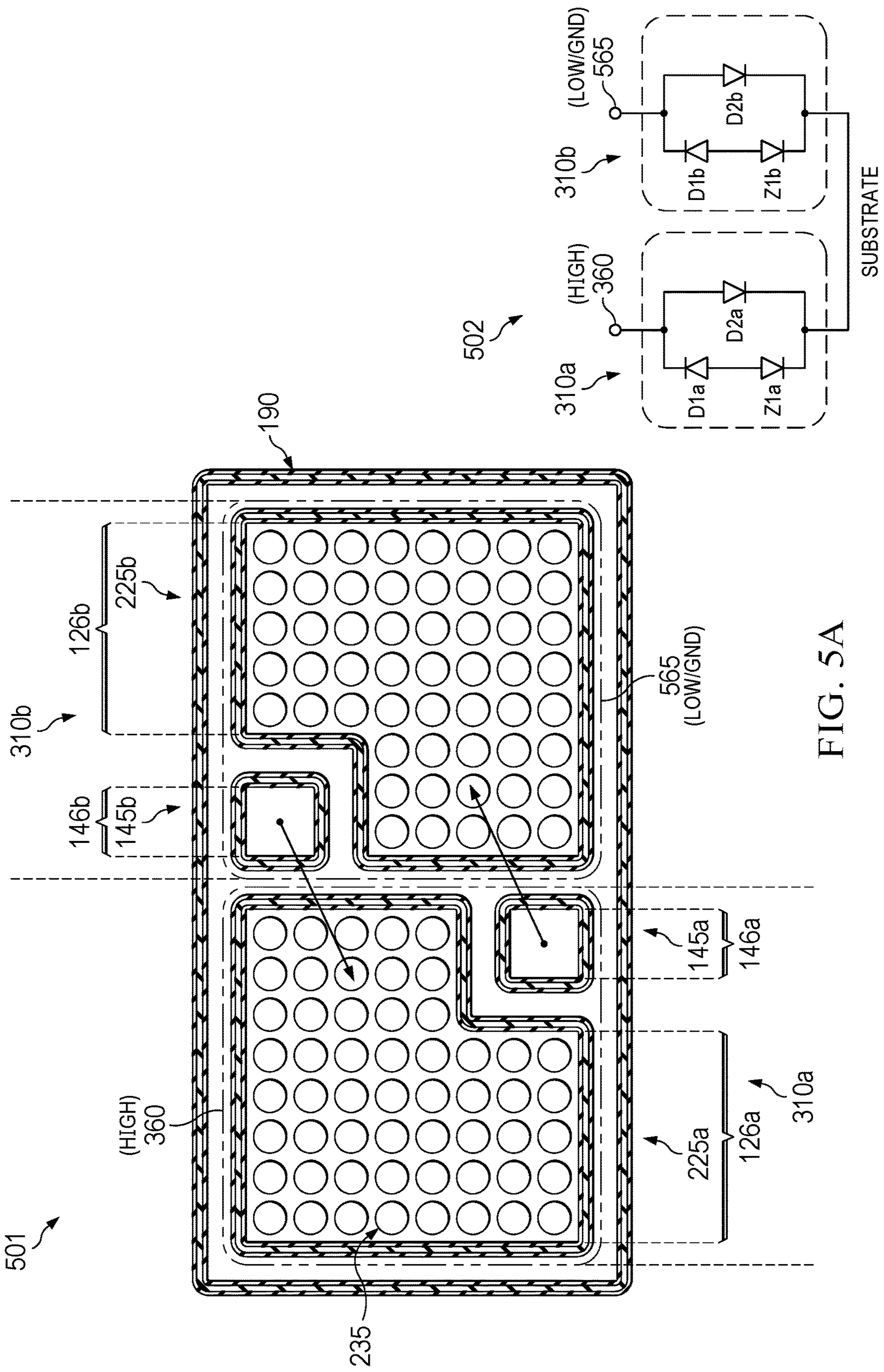
FIGS. 5A and 5B illustrate schematic diagrams and an equivalent circuit diagram of semiconductor devices in accordance with embodiments of the present disclosure.
Figure 5B:
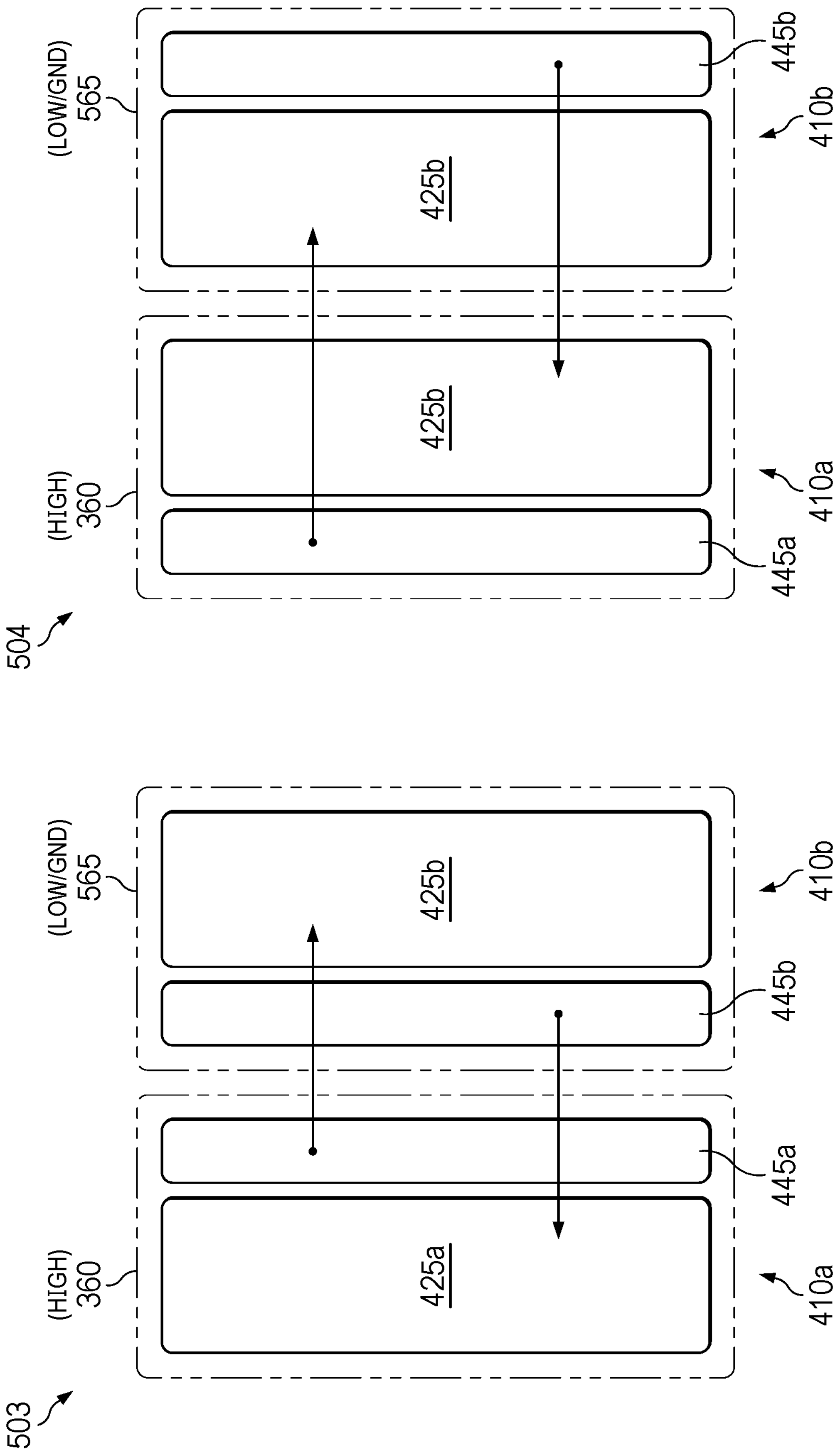

FIGS. 5A and 5B illustrate schematic diagrams of semiconductor devices 501, 503, and 504 and an equivalent circuit diagram 502 of the semiconductor devices 501, 503, and 504 in accordance with embodiments of the present disclosure. The schematic diagrams of semiconductor devices 501, 503, and 504 may be regarded as composite layouts of the semiconductor devices. The semiconductor devices 501, 503, and 504 are generally similar to the semiconductor device 301 and the semiconductor device 401 described with reference to FIGS. 3 and 4A, and therefore like reference numbers refer to like components of FIGS. 3 and 4A.

The semiconductor device 501 depicted in FIG. 5A may be regarded as a variation of the semiconductor device 301 described with reference to FIG. 3. The semiconductor device 501 has two channels 310*a* and 310*b*. The channel 310*a* is connected to the terminal 360 (denoted as HIGH terminal) and the channel 310*b* is connected to a terminal 565 (denoted as LOW/GND terminal). As such, the semiconductor device 501 may be regarded as an ESD (or surge) protection device configured to couple with two terminals of a DUP while the semiconductor devices 301 and 401 are configured to couple with three terminals of a DUP. FIG. 5A also illustrates the equivalent circuit diagram 502 including two channels 310*a* and 310*b*, each of which is connected to the terminal 360 and the terminal 565, respectively. As with the equivalent circuit diagram 302, the substrate 105 provides a common node for the channels 310*a* and 310*b*.

Conduction paths of avalanche current associated with ESD events between the HIGH and LOW/GND terminals are indicated as arrows in the semiconductor device 501 diagram. One or both of the channels 310*a* and 310*b* may be rotated to increase the distance (e.g., lateral distance) that the avalanche current travels during the ESD events—e.g., rotating clockwise by 90-degrees. The first diodes 225 of the semiconductor device 501 includes the multi-fingered n-type regions 235 that are expected to mitigate the risk of avalanche current crowding to a certain degree. The first diodes 225 (i.e., the first diode areas 226), however include re-entrant corners (e.g., the re-entrant corner R described with reference to FIG. 1A) that may render the semiconductor device 501 somewhat vulnerable to the risk of avalanche current crowing.

The semiconductor device 503 and the semiconductor device 504 depicted in FIG. 5B may be regarded as variations of the semiconductor device 401 described with reference to FIG. 4A. For example, the first diodes 425*a/b* includes the multi-fingered n-type regions 235. The semiconductor devices 503 and 504 have two channels 410*a* and 410*b*. The channel 410*a* is connected to the terminal 360 (denoted as HIGH terminal) and the channel 410*b* is connected to a terminal 565 (denoted as LOW/GND terminal). Conduction paths of avalanche current associated with ESD events between the HIGH and LOW/GND terminals are indicated as arrows in the diagrams of the semiconductor devices 503 and 504. The semiconductor devices 503 and 504 are expected to have greater avalanche current handling capability (e.g., It2) when compared to the semiconductor device 501 at least partially due to absence of the re-entrant corners. The semiconductor device 504 may have relatively greater avalanche current handling capability (e.g., It2) than the semiconductor device 503 in view of the relatively longer conduction paths (which may facilitate spreading of the avalanche current), in some embodiments.

While various embodiments of the present disclosure have been described above, it is to be understood that they have been presented by way of example and not limitation. Numerous changes to the disclosed embodiments can be made in accordance with the disclosure herein without departing from the spirit or scope of the present disclosure. In addition, while in the illustrated embodiments various features or components have been shown as having particular arrangements or configurations, other arrangements and configurations are possible. Moreover, aspects of the present technology described in the context of example embodiments may be combined or eliminated in other embodiments. Thus, the breadth and scope of the present disclosure is not limited by any of the above described embodiments.

What is claimed is:

1. A semiconductor device, comprising:

a p-type semiconductor layer including n-type semiconductor regions; and a trench isolation structure laterally surrounding the p-type semiconductor layer in a first diode area, and wherein any n-type semiconductor region disposed within the p-type semiconductor layer that is laterally surrounded by the trench isolation structure in the first diode area has:

a footprint with a circular, oval, or obround shape;

a uniform size throughout the p-type semiconductor layer such that each n-type semiconductor region has the same uniform size throughout the p-type semiconductor layer;

a boundary of the footprint spaced apart from the trench isolation structure that laterally surrounds the p-type semiconductor layer; and a first group of contacts connected to the n-type semiconductor region; and a second diode area including:

a p-type region in the p-type semiconductor layer; and a second group of contacts connected to the p-type region; and wherein:

the first diode area includes a first side and a second side, the first side intersecting the second side;

one or more of the n-type semiconductor regions are disposed along each of the first side of the first diode area and the second side of the first diode area;

the second diode area includes a third side and a fourth side, the third side intersecting the fourth side;

the first side of the first diode area extends along the third side of the second diode area without any other diode area disposed between the first side of first diode area and the third side of the second diode area; and the second side of the first diode area extends along the fourth side of the second diode area without any other diode area disposed between the second side of the first diode area and the fourth side of the second diode area.

2. The semiconductor device of claim 1, wherein the trench isolation structure includes a dielectric liner and a conductive material formed thereon.

3. The semiconductor device of claim 1, wherein the p-type semiconductor layer corresponds to a first p-type semiconductor layer, the semiconductor device further comprising:

a second p-type semiconductor layer on which the first p-type semiconductor layer is located, the second p-type semiconductor layer having a greater p-type dopant concentration than the first p-type semiconductor layer;

a first n-type semiconductor layer on which the second p-type semiconductor layer is located; and a second n-type semiconductor layer on which the first n-type semiconductor layer is located, the second n-type semiconductor layer having a greater n-type dopant concentration than the first n-type semiconductor layer.

4. The semiconductor device of claim 3, wherein:

a plurality of first pn junctions at a first depth from a surface of the first p-type semiconductor layer, the plurality of first pn junctions being across the n-type semiconductor regions and the first p-type semiconductor layer; and a second pn junction at a second depth from the surface greater than the first depth, the second pn junction being across the second p-type semiconductor layer and the first n-type semiconductor layer.

5. The semiconductor device of claim 3, wherein the n-type semiconductor regions, the first and second p-type semiconductor layers, and the first n-type semiconductor layer form an open-base npn bipolar transistor.

6. The semiconductor device of claim 5, wherein:

the first group of contacts is coupled to a terminal;

the terminal corresponds to a first terminal of the open-base npn bipolar transistor; and the second n-type semiconductor layer corresponds to a second terminal of the open-base npn bipolar transistor.

7. The semiconductor device of claim 3, wherein the trench isolation structure extends from a surface of the first p-type semiconductor layer past an interface between the first and the second n-type semiconductor layers.

8. The semiconductor device of claim 1, further comprising a p-type region disposed in the p-type semiconductor layer, the p-type region having a different p-type dopant concentration than the p-type semiconductor layer; and wherein:

at least one of the n-type semiconductor regions interfaces with the p-type region; and the p-type semiconductor layer interfaces with the at least one of the n-type semiconductor regions.

9. The semiconductor device of claim 8, wherein the p-type region has a greater p-type dopant concentration than the p-type semiconductor layer.

10. The semiconductor device of claim 8, wherein the p-type region extends continuously from the at least one of the n-type semiconductor regions to the trench isolation structure.

11. The semiconductor device of claim 1, wherein each first group of contacts from each n-type semiconductor region are coupled to a terminal.

12. The semiconductor device of claim 1, wherein:

the trench isolation structure includes a first portion and an opposing second portion, the n-type semiconductor regions includes a first set of n-type semiconductor regions, each n-type semiconductor region of the first set of n-type semiconductor regions being spaced apart from the first portion of the trench isolation structure a first distance, the n-type semiconductor regions includes a second set of n-type semiconductor regions, each n-type semiconductor region of the second set of n-type semiconductor regions being spaced apart from the second portion of the trench isolation structure the first distance, there are no other n-type semiconductor regions disposed between the first set of n-type semiconductor regions and the first portion of the trench isolation structure, there are no other n-type semiconductor regions disposed between the second set of n-type semiconductor regions and the second portion of the trench isolation structure, the first set of n-type semiconductor regions being positioned closer to the first portion of the trench isolation structure than the second set of n-type semiconductor regions, and the first and second set of n-type semiconductor regions each include two or more n-type semiconductor regions.

13. A semiconductor device, comprising:

an n-type substrate;

an n-type layer on the n-type substrate;

a p-type layer over the n-type layer; and a first trench isolation structure laterally surrounding the p-type layer such that an outer perimeter of a first diode area is defined by the first trench isolation structure, and n-type regions disposed in the p-type layer within the first diode area, wherein any n-type region disposed in the p-type layer within the first diode area has:

a footprint with a circular, oval, or obround shape;

a uniform size throughout the p-type layer such that each n-type region has the same uniform size throughout the p-type layer;

a boundary of the footprint spaced apart from the first trench isolation structure that laterally surrounds the first diode area; and a first group of contacts connected to the n-type region; and a second diode area including:

a p-type region in the p-type layer; and a second group of contacts connected to the p-type region; and wherein:

the first diode area includes a first side and a second side such that a re-entrant corner is formed at an intersection of the first side and the second side of the first diode area;

one or more of the n-type regions are disposed along each of the first side of the first diode area, the re-entrant corner, and the second side of the first diode area;

the second diode area includes a third side and a fourth side;

the first side of the first diode area extends along the third side of the second diode area without any other diode area disposed between the first side of first diode area and the third side of the second diode area; and the second side of the first diode area extends along the fourth side of the second diode area without any other diode area disposed between the second side of the first diode area and the fourth side of the second diode area.

14. The semiconductor device of claim 13, wherein the p-type layer and the n-type regions forms a plurality of first pn junctions at a first depth from a surface of the p-type layer that faces away from the n-type substrate.

15. The semiconductor device of claim 14, wherein the first diode area further includes a second pn junction at a second depth from the surface greater than the first depth, the second pn junction formed across the n-type layer and a p-type buried region extended from the p-type layer toward the n-type substrate.

16. The semiconductor device of claim 15, wherein the n-type regions, the p-type layer, the p-type buried region, and the n-type layer form an open-base npn bipolar transistor.

17. The semiconductor device of claim 15, wherein the second diode area includes a third pn junction at a third depth from the surface greater than the first depth and less than the second depth, the third pn junction formed across the p-type layer and the n-type layer.

18. The semiconductor device of claim 13, wherein:

a second trench isolation structure laterally surrounds the second diode area; and the first and second trench isolation structures extend past an interface between the n-type layer and the n-type substrate.

19. The semiconductor device of claim 13, wherein the first and second groups of contacts are connected to a terminal.

20. The semiconductor device of claim 13, wherein:

the first group of contacts of the first diode area is connected to a first terminal the second group of contacts of the second diode area is connected to a second terminal.

21. The semiconductor device of claim 13, further comprising a p-type region disposed in the p-type layer, the p-type region having a greater p-type dopant concentration than the p-type layer; and wherein:

the n-type regions interface with the p-type region; and the p-type layer interfaces with the n-type regions.

22. The semiconductor device of claim 21, wherein the p-type region extends continuously from at least one of the n-type regions to the first trench isolation structure.

23. The semiconductor device of claim 13, wherein the first diode area is a first low capacitance diode area, the second diode area is a first parallel diode area and the n-type regions is a first plurality of n-type regions, the semiconductor device further comprising:

a second low capacitance diode area including a second plurality of n-type regions in the p-type layer, wherein each of the n-type regions in the second plurality of n-type regions has:

the footprint with the circular, oval, or obround shape; and the uniform size throughout the p-type layer such that each n-type region has the same uniform size throughout the p-type layer; and wherein the first parallel diode area is located between the first and second low capacitance diode areas.

24. The semiconductor device of claim 23, wherein the p-type region is a first p-type region, the semiconductor device further comprising:

a second parallel diode area disposed along a fifth side of the first low capacitance diode area and along a sixth side and seventh side of the second low capacitance diode area, the second parallel diode area including:

a second p-type region in the p-type layer; and a third group of contacts connected to the second p-type region; and a second trench isolation structure laterally surrounding the second low capacitance diode area;

a third trench isolation structure laterally surrounding the first parallel diode area; and a fourth trench isolation structure laterally surrounding the second parallel diode area.

25. The semiconductor device of claim 24, the semiconductor device further comprising:

a third low capacitance diode area including a third plurality of n-type regions in the p-type layer, wherein each of the n-type regions in the third plurality of n-type regions has:

the footprint with the circular, oval, or obround shape; and the uniform size throughout the p-type layer such that each n-type region has the same uniform size throughout the p-type layer; and a third parallel diode area located between the first and third low capacitance diode areas, the third parallel diode area including:

a third p-type region in the p-type layer; and a fourth group of contacts connected to the third p-type region; and wherein the second low capacitance diode area is disposed along an eighth side of the first parallel diode area and the third low capacitance diode area is disposed along a ninth side of the first low capacitance diode area, the ninth side being opposite the fifth side.

26. The semiconductor device of claim 25, wherein no other diode areas are located between the first and third low capacitance diode areas besides the third parallel diode area.

27. The semiconductor device of claim 25, wherein:

the first low capacitance diode area includes a tenth side intersecting the first side and the ninth side of the first low capacitance diode area and an eleventh side intersecting the fifth side and the ninth side of the first low capacitance diode area, the first parallel diode area being positioned closer to the tenth side of the first low capacitance diode area than the eleventh side of the first low capacitance diode area, the second parallel diode area being positioned closer to the eleventh side of the first low capacitance diode area than the tenth side of the first low capacitance diode area, and the third parallel diode area being positioned closer to the eleventh side of the first low capacitance diode area than the tenth side of the first low capacitance diode area.

28. The semiconductor device of claim 13, further comprising:

a second trench isolation structure laterally surrounding the second diode area, the second trench isolation structure spaced apart from the first trench isolation structure; and a third trench isolation structure laterally surrounding the first and second diode areas, the third trench isolation structure spaced apart from the first and second trench isolation structures.

29. The semiconductor device of claim 23, wherein the p-type region is a first p-type region, the semiconductor device further comprising:

a second parallel diode area including:

a second p-type region in the p-type layer; and a third group of contacts connected to the second p-type region; and wherein:

the re-entrant corner is a first re-entrant corner;

the second parallel diode area has a fifth side and an opposing sixth side and a seventh side intersecting the fifth and sixth sides of the second parallel diode area;

the second low capacitance diode area includes an eighth side and a ninth side such that a second re-entrant corner is formed at an intersection of the eighth side and the ninth side of the second low capacitance diode area;

one or more of the n-type regions of the second plurality of n-type regions are disposed along each of the eighth side of the second low capacitance diode area, the second re-entrant corner, and the ninth side of the second low capacitance diode area;

the eighth side of the second low capacitance diode area extends along the sixth side of the second parallel diode area without any other diode area disposed between the eighth side of the second low capacitance diode area and the sixth side of the second parallel diode area; and the ninth side of the second low capacitance diode area extends along the seventh side of the second parallel diode area without any other diode area disposed between the ninth side of the second low capacitance diode area and the seventh side of the second parallel diode area.

30. The semiconductor device of claim 29, wherein:

the first low capacitance diode area includes a tenth side that intersects the second side of the first low capacitance diode area; and the fifth side of the second parallel diode area extends along the tenth side of the first low capacitance diode area without any other diode area disposed between the tenth side of the first low capacitance diode area and the fifth side of the second parallel diode area.

31. The semiconductor device of claim 23, wherein:

the second low capacitance diode area includes a fifth side that faces a sixth side of the first parallel diode area, the sixth side being opposite the third side of the first low capacitance diode area; and the fifth side of the second low capacitance diode area extends along the sixth side of the first parallel diode area without any other diode area disposed between the fifth side of the second low capacitance diode area and the sixth side of the first parallel diode area.

32. The semiconductor device of claim 31, wherein the p-type region is a first p-type region, the semiconductor device further comprising:

a second parallel diode area including:

a second p-type region in the p-type layer; and a third group of contacts connected to the second p-type region; and wherein:

the first low capacitance diode area further includes a seventh side that intersects the second side of the first low capacitance diode area;

one or more of the n-type regions of the first plurality of n-type regions are disposed along the seventh side of the first low capacitance diode area;

the second low capacitance diode area further includes an eighth side that intersects the fifth side of the second low capacitance diode area;

one or more of the n-type regions of the second plurality of n-type regions are disposed along the eighth side of the second low capacitance diode area; and the second parallel diode area has a ninth side extending along the seventh side of the first low capacitance diode area without any other diode area disposed between the ninth side of the second parallel diode area and the seventh side of the first low capacitance diode area; and the second parallel diode area has a tenth side extending along the eighth side of the second low capacitance diode area without any other diode area disposed between the tenth side of the second parallel diode area and the eighth side of the second low capacitance diode area.

* * * * *